United States Patent [19]

Carobolante

[11] Patent Number: 5,157,351
[45] Date of Patent: Oct. 20, 1992

[54] INSULATED GATE ENHANCEMENT MODE FIELD EFFECT TRANSISTOR WITH SLEW-RATE CONTROL ON DRAIN OUTPUT

[75] Inventor: Francesco Carobolante, Phoenix, Ariz.

[73] Assignee: SGS-Thomson Microelectronics, Inc., Carrollton, Tex.

[21] Appl. No.: 751,410

[22] Filed: Aug. 28, 1991

[51] Int. Cl.⁵ .............................................. H03F 3/16
[52] U.S. Cl. ................................... 330/277; 330/294; 330/302
[58] Field of Search ................ 330/263, 265, 277, 300, 330/294, 302, 310, 311; 307/491, 495, 496, 497

[56] References Cited

U.S. PATENT DOCUMENTS 4,134,076  1/1979  Suzuki et al. ..................... 330/251 X
5,015,968  5/1991  Podell et al. ......................... 330/277

Primary Examiner—Steven Mottola
Attorney, Agent, or Firm—Ronald S. Lombard; Richard A. Bachand; Lisa K. Jorgenson

[57] ABSTRACT

Voltage slew-rate control for inductive load connected to the drain of an insulated gate enhancement mode field effect transistor is disclosed. The voltage slew-rate control is accomplished by incorporating a current integrator between the gate and drain of the field effect transistor, thereby effectively annihilating the capacitance of the field effect transistor which has heretofore proven to be generally responsible for instability and oscillations when slew-rate control is attempted in such a circuit. The current integrator includes a capacitor and a current source in circuit with a high speed unity gain buffer amplifier. The buffer amplifier preferably has a low impedance through the frequencies of interest to prevent the natural resonances of stray capacitances with the inductive load.

25 Claims, 1 Drawing Sheet

INSULATED GATE ENHANCEMENT MODE FIELD EFFECT TRANSISTOR WITH SLEW-RATE CONTROL ON DRAIN OUTPUT

BACKGROUND OF THE INVENTION

The present invention relates to an electronic circuit including an insulated gate enhancement mode field effect transistor, and, in particular, to a circuit including load voltage slew-rate control on the drain output of the field effect transistor. In many driving applications with inductive loads, such as, motors and coils, for example, it is of interest to limit the voltage slew-rate on the inductive load. This is particularly desirable at turn-off of the load in order to reduce electromagnetic disturbances and other related problems. Because of the structure and electrical characteristics of an insulated gate enhancement mode field effect transistor, this has been found difficult to achieve. The local feedback representative of the gate-drain capacitance is generally responsible for instability and oscillations when such a slew-rate control is attempted with an inductive load. The slew-rate voltage on a load may be defined as the maximum rate of change of the output voltage of the load.

SUMMARY OF THE INVENTION

The present invention provides a slew-rate control circuit in combination with a drive circuit which includes an insulating gate enhancement mode field effector transistor. Such a transistor has an insulated gate, a source and a drain. The drive circuit also includes an inductive load connected in circuit with the drain of the field effect transistor.

The improvement of the present invention comprises providing a load voltage slew-rate control which includes a current integrator. The current may be constant or time dependent, for example, the current integrator is connected in circuit between the gate and the drain of the field effect transistor, whereby, the local feedback at the gate of the field effect transistor due to gate-drain capacitance is effectively annihilated by the current integrator.

Preferably, the current integrator includes a capacitor having one end connected in circuit to the drain of the field effect transistor and the other end of the capacitor connected in circuit to a constant current source. A buffer amplifier is provided having a predetermined operating frequency range. The buffer amplifier is connected in circuit between the other end of the capacitor and the gate of the field effect transistor.

Desirably the buffer amplifier has a predetermined output impedance of less than 500 ohms over its operating frequency range. It has been found desirable that the operating frequency range of the buffer amplifier is such that the bandwidth of the buffer amplifier is at least ten times the resonant frequency of the inductive load including associated components and, said field effect transistor.

BRIEF DESCRIPTION OF THE DRAWINGS

For a better understanding of the invention, reference may be had to the accompanying drawings exemplary of the invention, in which.

BRIEF DESCRIPTION OF THE PREFERRED EMBODIMENT

Figure 1:
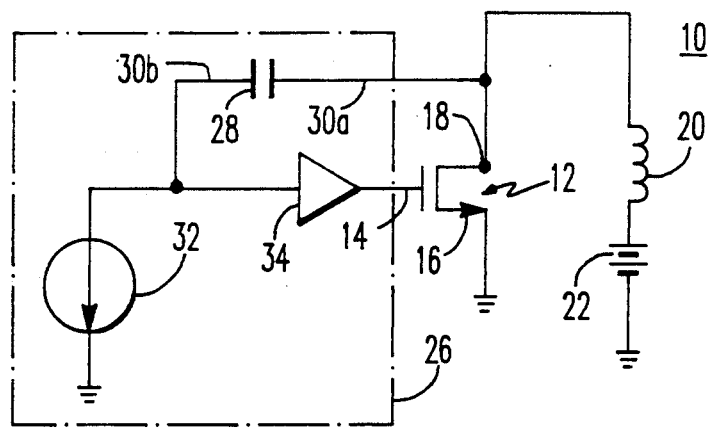
FIG. 1 is a schematic diagram of the present invention.

Referring to FIG. 1, there is shown in combination a circuit 10 including an insulated gate enhancement mode field effect transistor 12. Such a transistor typically includes an insulated polysilicon gate 14, a source 16, and a drain 18. An inductive load 20 is connected as shown in FIG. 1 in circuit with the drain 18 and a voltage source 22. As hereinbefore stated, it is often desirable to limit the voltage slew-rate on the load 20, especially at turn-off, in order to reduce electromagnetic disturbances and other related problems. As already stated, this has proven difficult to obtain because of the local feedback represented by the gate-drain capacitance of the transistor 12 which often causes instability and oscillations when slew-rate control is attempted with an inductive load.

The present invention utilizes a load voltage slew-rate control comprising a current integrator 26.

The current integrator preferably comprises capacitor 28 having one end 30a connected in circuit between the load 20 and the drain 18 of transistor 12. A current source 32 is connected in circuit with the other end 30b of the capacitor 28. A buffer amplifier 34 is connected in circuit between the other end 30b of the capacitor 28 and the gate 14 of the field effect transistor 12.

Figure 2:
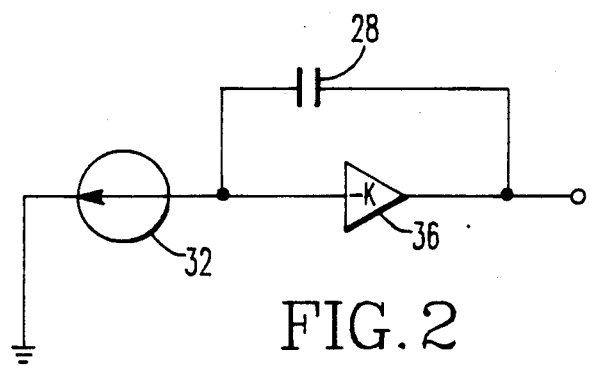
FIG. 2 is a schematic diagram showing an equivalent circuit of the current integrator.

The present invention utilizes the gain of the buffer amplifier for integration of the current, from current source 32. FIG. 2 shows that the circuit is equivalent to an integrator, and the current, $I_{in}$ positive or negative, of the current source 32 is integrated by the capacitance C of the capacitor 28 into a linear output voltage variation, assuming $I_{in}$ is constant:

$$\frac{dV_{OUT}}{dt} = \frac{I_{in}}{C}$$

The amplifier 36 shown in FIG. 2 represents the generic gain, -K, of the buffer amplifier 34 together with the gain of the field effect transistor 12, shown in FIG. 1.

Preferably, the buffer amplifier has a predetermined output impedance of less than about 500 ohms over its operating frequency range. It is desirable that the buffer amplifier 34 has a predetermined frequency range such that the bandwidth of the buffer amplifier is at least ten times the resonant frequency of the load including parasitics, resulting in a "high speed" buffer amplifier.

Figure 3:
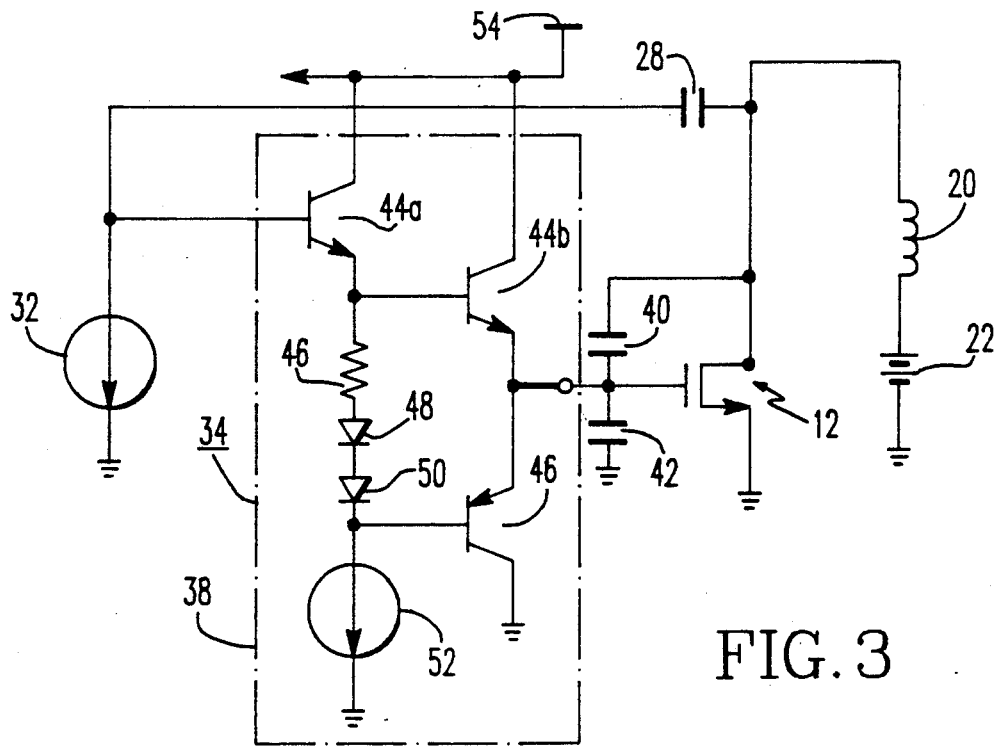
FIG. 3 is a detailed schematic diagram of a preferred embodiment of the present invention.

Referring to FIG. 3, it has been found that the buffer stage 38 of the buffer amplifier 34 is preferably a class AB-type amplification stage. This provides for a biasing current on the output stage of amplifier 34. The invention requires a "high speed" unity gain buffer amplifier 34. The term "high speed" means that the bandwidth of the amplifier 34 is much larger when compared to the resonant frequency of the field effect transistor 12 and associated components and load. As a first order estimate such resonant frequency, $$F_R = \frac{1}{2\pi \sqrt{LC}}$$

where L is the inductance of the load and C is the total parasitic capacitance of load and associated components and transistor 12. For example, if L is in the range of 0.5 to 10 mH and C is in the range of 0.5 to 5 nF, the resonant frequency, $F_R$, is less than 500 kilohertz and a buffer 34 with a 5 megahertz bandwidth is appropriate.

As stated before, the impedance of the buffer amplifier 34 has to be reasonably small over an extended range of frequency such as from 0 to 5 MHz. Referring to FIG. 3, the gate to drain capacitance 40 of the field effect transistor 12 is shown. Typically, with zero bias, i.e., zero voltage between gate and drain, capacitance 40 is about 100 to 500 picofarads, for example, depending on the device. Similarly, the gate to source capacitance 42 is 50 to 500 picofarads for example.

The following is a table of components for the circuits shown in FIGS. 1, 2 and 3.

| TABLE OF COMPONENTS | | | |
|---|---|---|---|
| Component | Manufacturer | Model | Value |
| Transistors (44a, 44b) | | 2N2222 | |
| Transistor (46) | | 2N2907 | |
| Resistor (46) | | | 2.2 Kohm |
| Diode (48) | | 2N2222 Collector Base Connected | |
| Diode (50) | | 2N2907 Collector Base Connected | |
| Field Effect Transistor (12) | SGS-Thomson | SGS P358 | |
| Capacitor (28) | | | 25 pF |
| DC Voltage source (22) | | | 5 volts |
| Inductor (20) | | | 1 mH, 5 ohm resistance |

Biasing current source 52 may be set at 40 μA, for example. The constant current source 32 may be set at 5 μA. In this example, assuming a base current of transistor 44a is negligible, the voltage slew-rate is a function of the $$\frac{dv}{dt} = \frac{I_{in}}{C} = \frac{5 \mu A}{25 pF} = \frac{0.20 v}{\mu sec.}$$

The supply voltage 54 may be set at 12 volts, for example. Using the buffer amplifier shown in FIG. 3, buffer stage 38 is a class AB-type amplifier which imposes a biasing current on the output stage of the buffer which is beneficial to maintain low output impedance levels during operation.

I claim:

1. In combination with circuit means including an insulated gate enhancement mode field effect transistor means, said field effect transistor means including a gate, a source and a drain, an inductive load means connected in circuit with said drain of said field effect transistor, the improvement which comprises:
   load voltage slew-rate control means comprising constant current integrator means, said constant current integrator means connected in circuit between said gate and said drain of said field effect transistor means, whereby, a local feedback at said gate of said field effect transistor means due to gate-drain capacitance is effectively annihilated by said constant current integrator means.

2. The combination of claim 1, wherein said current integrator means comprises capacitor means having one end connected in circuit between said load and said drain of said field effect transistor means, a current source connected in circuit with the other end of said capacitor means, a buffer amplifier means having a predetermined operating frequency range is connected in circuit between said other end of said capacitor means and said gate of said field effect transistor means.

3. The combination of claim 2, wherein said current source is a constant current source.

4. The combination of claim 2, wherein said buffer amplifier means comprises NPN-type transistors.

5. The combination of claim 2, wherein said buffer amplifier means has a predetermined output impedance of less than about 500 ohms over the operating frequency range of said buffer amplifier means.

6. The combination of claim 5, wherein said buffer amplifier means has an operating frequency range such that the bandwidth of said buffer amplifier means is at least ten times the resonant frequency of said load means together with said field effect transistor means.

7. The combination of claim 2, wherein said buffer amplifier means comprises a class AB-type amplification stage.

8. A circuit for driving an inductive load, comprising:
   an insulated gate enhancement mode field effect transistor having a gate, a source, and a drain, the drain being connected in circuit with said inductive load,
   a current integrator connected in circuit between the gate and the drain of said field effect transistor to control a voltage slew-rate to said inductive load.

9. The circuit of claim 8 wherein said current integrator is a constant current integrator.

10. The circuit of claim 8 wherein said current integrator comprises a capacitor having one end connected between said inductive load and the drain of said field effect transistor, a current source connected with another end of said capacitor, and a buffer amplifier having a predetermined operating frequency range connected between said another end of said capacitor and the gate of said field effect transistor.

11. The circuit of claim 10 wherein said buffer amplifier is a high speed unity gain buffer amplifier.

12. The circuit of claim 10 wherein said current source is a constant current source.

13. The circuit of claim 10 wherein said current source is time dependent.

14. The circuit of claim 10 wherein said buffer amplifier comprises NPN transistors.

15. The circuit of claim 10 wherein said buffer amplifier has a predetermined output impedance of less than about 500 ohms over the predetermined operating frequency.

16. The circuit of claim 10 wherein said buffer amplifier has a bandwidth at least ten times the resonant frequency of said load together with said field effect transistor.

17. The circuit of claim 10 wherein said buffer amplifier comprises a class AB-type amplifier.

18. A driver for an inductive load, comprising:
   an enhancement mode FET, having a source and a drain for connection in a current path with said inductive load, and a gate;
   a buffer amplifier having a predetermined operating frequency range to reduce feedback due to a gate to drain capacitance of said FET;
   a current source connected to an input of said buffer amplifier; and
   a capacitor connected between the drain of said field effect transistor and the input of said buffer amplifier.

19. The driver of claim 18 wherein said buffer amplifier is a high speed unity gain buffer amplifier.

20. The driver of claim 18 wherein said current source is a constant current source.

21. The driver of claim 18 wherein said current source is a time dependent current source.

22. The driver of claim 18 wherein said buffer amplifier comprises NPN transistors.

23. The driver of claim 18 wherein said buffer amplifier has a predetermined output impedance of less than about 500 ohms over the predetermined operating frequency range.

24. The driver of claim 18 wherein said buffer amplifier has a bandwidth at least ten times the resonant frequency of said load together with said field effect transistor.

25. The driver of claim 18 wherein said buffer amplifier comprises a class AB-type amplifier.

* * * * *